United States Patent
Zeyen

(10) Patent No.: US 10,017,381 B2
(45) Date of Patent: Jul. 10, 2018

(54) MICROFABRICATED PRESSURE TRANSDUCER

(71) Applicant: Innovative Micro Technology, Goleta, CA (US)

(72) Inventor: Benedikt Zeyen, Santa Barbara, CA (US)

(73) Assignee: Innovative Micro Technology, Goleta, CA (US)

( * ) Notice: Subject to any disclaimer, the term of this patent is extended or adjusted under 35 U.S.C. 154(b) by 0 days.

(21) Appl. No.: 15/477,593

(22) Filed: Apr. 3, 2017

(65) Prior Publication Data

US 2017/0283252 A1 Oct. 5, 2017

Related U.S. Application Data

(60) Provisional application No. 62/318,055, filed on Apr. 4, 2016.

(51) Int. Cl.
| | |
|---|---|
| *G01L 7/22* | (2006.01) |
| *G01L 7/24* | (2006.01) |
| *B81C 1/00* | (2006.01) |
| *G01L 7/16* | (2006.01) |
| *G01L 7/02* | (2006.01) |
| *G01L 9/00* | (2006.01) |
| *B81B 3/00* | (2006.01) |

(52) U.S. Cl.
CPC ........ *B81C 1/00182* (2013.01); *B81B 3/0018* (2013.01); *G01L 7/022* (2013.01); *G01L 7/024* (2013.01); *G01L 7/026* (2013.01); *G01L 7/163* (2013.01); *G01L 9/0001* (2013.01); *G01L 9/0089* (2013.01); *B81B 2201/0264* (2013.01); *B81C 2201/01* (2013.01)

(58) Field of Classification Search
CPC ..... B81C 1/0082; B81B 3/0018; G01L 7/022; G01L 7/024; G01L 7/026; G01L 7/163
USPC .......................................................... 73/744
See application file for complete search history.

(56) References Cited

U.S. PATENT DOCUMENTS

| | | | | |
|---|---|---|---|---|
| 5,177,661 | A * | 1/1993 | Zavracky | G01L 9/0042 361/283.4 |
| 2006/0075818 | A1* | 4/2006 | Huang | B06B 1/0292 73/649 |
| 2012/0248063 | A1* | 10/2012 | De Brabander | B81B 3/0021 216/36 |
| 2013/0010990 | A1* | 1/2013 | Sridharan | H04R 19/00 381/175 |
| 2015/0040675 | A1* | 2/2015 | Ding | G01L 19/04 73/754 |
| 2016/0187214 | A1* | 6/2016 | Al-Hemyari | G01B 11/161 73/31.04 |
| 2018/0010589 | A1* | 1/2018 | Zeyen | F04B 19/006 |

* cited by examiner

*Primary Examiner* — Harshad R Patel
*Assistant Examiner* — Jamel Williams
(74) *Attorney, Agent, or Firm* — Jaquelin K. Spong

(57) ABSTRACT

A microfabricated pressure transducer is formed in a multilayer substrate by etching a plurality of shallow and deep wells into the layers, and then joining these wells with voids formed by anisotropic etching. The voids define a flexible membrane over the substrate which deforms when a force is applied.

20 Claims, 2 Drawing Sheets

MICROFABRICATED PRESSURE TRANSDUCER

CROSS REFERENCE TO RELATED APPLICATIONS

This non-provisional US Patent Application claims priority to U.S. Provisional Patent Application 62/318,055, filed Apr. 4, 2016.

STATEMENT REGARDING FEDERALLY SPONSORED RESEARCH

Not applicable.

STATEMENT REGARDING MICROFICHE APPENDIX

Not applicable.

BACKGROUND

This invention relates to a microfabricated pressure transducer formed on a multilayer substrate.

Microelectromechanical systems (MEMS) are very small moveable structures made on a substrate using lithographic processing techniques, such as those used to manufacture semiconductor devices. MEMS devices may be moveable actuators, sensors, valves, pistons, or switches, for example, with characteristic dimensions of a few microns to hundreds of microns. One example of a MEMS device is a microfabricated cantilevered beam, which may be used to switch electrical signals. Because of its small size and fragile structure, the movable cantilever may be enclosed in a cavity to protect it and to allow its operation in an evacuated environment. Therefore, upon fabrication of the moveable structure on a device wafer, the device device wafer may be mated with a lid wafer, in which depressions have been formed to allow clearance for the structure and its movement. To maintain the vacuum over the lifetime of the device, a getter material may also be enclosed in the device cavity upon sealing the lid wafer against the device wafer.

Movable MEMS devices may include actuators, sensors and switches. Microfabricated pressure sensors comprise a small but useful subset MEMS devices. Microfabricated sensors can be very sensitive to pressure changes, making them ideal for applications in which bulky machined sensors are not able to perform, or are too large, or consume too much power. Typical applications of integrated pressure sensors include microphones, biomedical instrumentation (e.g., blood and fluid pressure), vacuum sensing, wind-tunnel model instrumentation, automobile power and acceleration measurement, and even household electronics.

Generally, mechanical sensors are based on material changes caused by stress placed on a membrane or other flexible element. The most common and inexpensive type, is based on the piezoresistive effect, wherein the resistance of the piezoresistive element changes as a function of strain. Piezoresitors can be made of doped silicon or polysilicon. Polysilicon has better stability, avoids time- and temperature-variant p-n junctions, and can be used in operating temperatures up to 200° C. On the submillimeter scale of integrated devices, materials like silicon show very little or no fatigue, which is apparently a macroscale phenomenon. Thus integrated sensors can be flexed indefinitely, and have a long lifetime.

In addition to sensors based on the piezoresistive effect, there also exist high-precision sensors based on capacitive effect. A membrane is also used, with one plate of a capacitor mounted on the membrane and the other plate suspended above it, usually fabricated on a relatively inflexible material such as Pyrex glass. The deflection of the membrane changes the distance between the plates and thus changes the capacitance. Capacitors tend to be much less temperature and time variant than piezoresistors. Output of capacitive sensors is highly appropriate for switched-cap circuit design.

However, each of the aforementioned devices may be rather complex and expensive to manufacture. Accordingly, microfabricated, low cost pressure transducers have posed an unresolved problem.

SUMMARY

A microfabricated pressure transducer may use a membrane that deflects under a force. This deflection may then be measured any of a number of ways, for example optically, or piezoelectrically.

In the systems and methods described here, the microfabricated pressure transducer may be formed from a substrate of one or more materials with two embedded etch stop layers defining a top, center and bottom substrate part. The top substrate part may have a number of shallow wells extending through the top substrate part, and defining a perforated membrane in the top substrate part which is suspended over a first void. The top and center substrate parts may also have a plurality deep wells, the deep wells being deeper than the shallow wells and extending through the top and center substrate parts. The deeper wells may define a smaller unperforated membrane on the bottom substrate which is suspended over a second void, wherein the perforated and unperforated membranes form a force-to-pressure transducer.

A method for forming the microfabricated pressure transducer may include: providing a three layer substrate having a top, center and bottom layer, wherein the layers are separated by an upper and a lower etch stop, forming a plurality of holes through the top layer; forming a void below the top layer and above the bottom layer, but leaving at least one structure connecting the top and the bottom layers to form the pressure transducer.

These and other features and advantages are described in, or are apparent from, the following detailed description.

BRIEF DESCRIPTION OF THE DRAWINGS

Various exemplary details are described with reference to the following figures, wherein.

It should be understood that the drawings are not necessarily to scale, and that like numbers may refer to like features.

DETAILED DESCRIPTION

Figure 1:
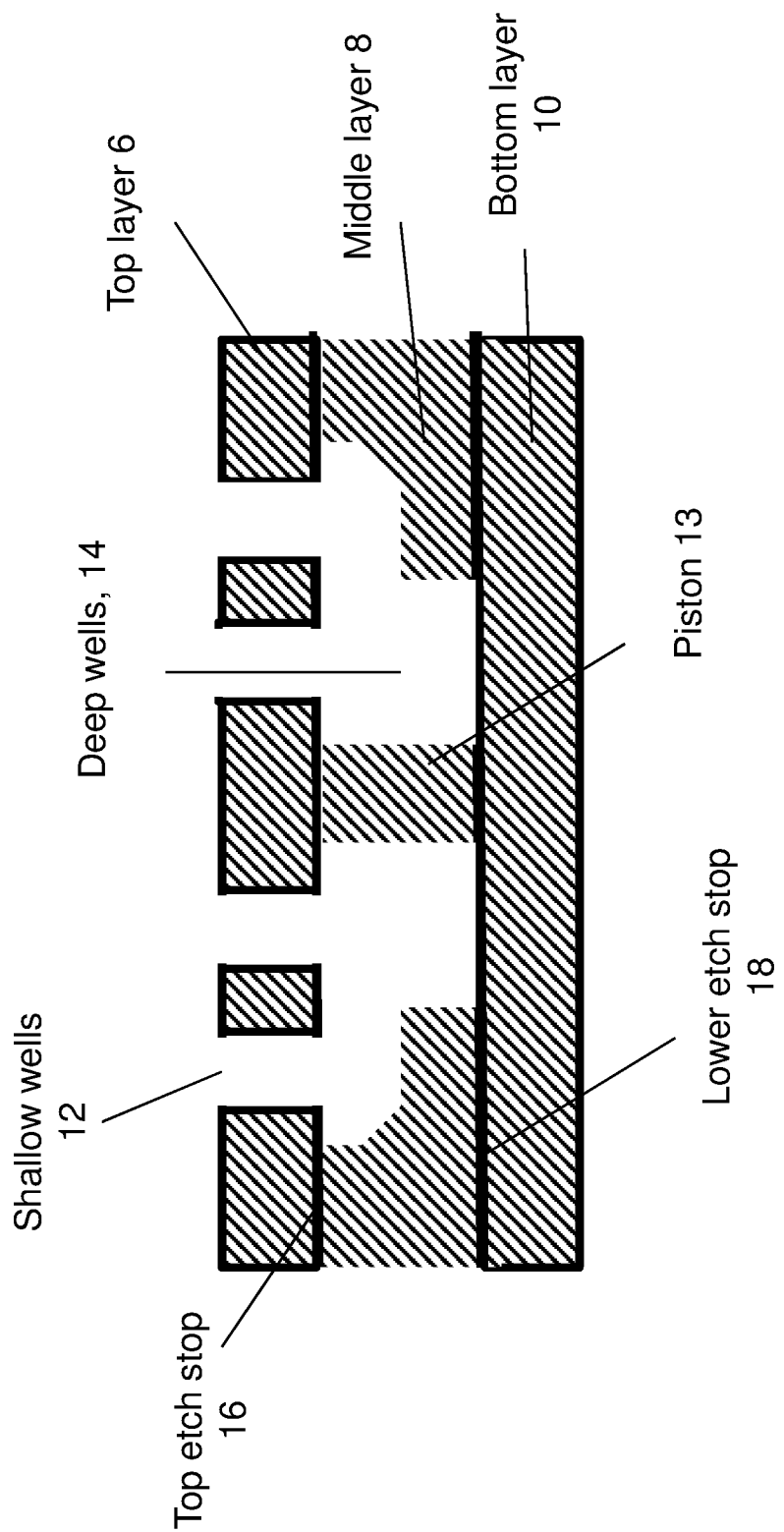
FIG. 1 is a cross sectional schematic diagram of the microfabricated pressure transducer.
Figure 2:
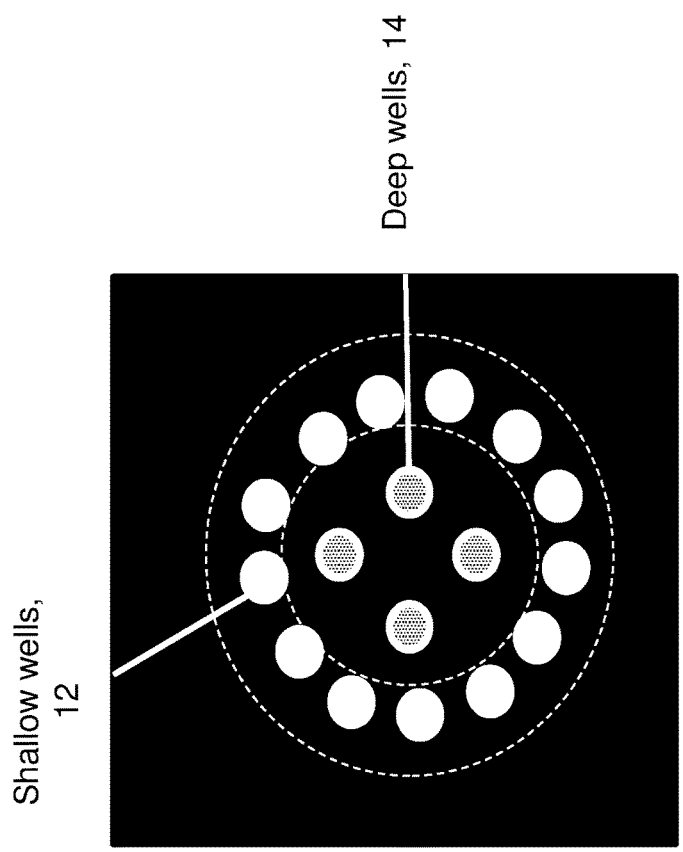
FIG. 2 is a plan view of the microfabricated pressure transducer.

The systems and methods described herein may make use of a multilayer substrate, wherein three layers making up the substrate are separated by two etch stop layers, an upper etch stop layer and a lower etch stop layer. The etch stops may be, for example, an oxide of metal. The etch stops may be formed by, for example, the repetitive bonding of oxidized silicon wafers and appropriate grinding and polishing. Alternatively, the top substrate layer may be a glass, for example a borosilicate, that is anodically bonded to the center substrate. In that case the substrate itself would also include the etch stop on the top surface, the sidewalls; and the top buried etch stop all at once.

The bottom substrate may also alternatively be a glass, for example again a borosilicate glass, that is anodically bonded to the center substrate. In that case the substrate itself would also include the etch stop on the bottom surface.

Generally, the multilayer substrate may comprise various materials, each separated from the others by an etch stop material, a material that etches at a slower rate, or not at all, compared to the surrounding material. The method may include providing a multilayer substrate having a top, center and bottom layer, wherein the layers are separated by top and bottom etch stop layers, forming a plurality of holes through the top layer and top etch stop layer, and forming a void below the top layer and top etch stop layer and above the bottom layer and bottom etch stop layer, but leaving at least one structure connecting the top and the bottom layers to form the pressure transducer.

In one embodiment described below, the multilayer substrate has three silicon layers, top layer 6, middle layer 8 and bottom layer 10. Each of the layers 6, 8 and 10 may be separated by a silicon dioxide etch stop layer, upper etch stop layer 16 and lower etch stop layer 18. A plurality of blind holes or wells may be etched into these layers as follows.

The shallow 12 and deep 14 wells are etched together through the top silicon substrate layer 6. The entire substrate is then oxidized to form the sidewall etch stops. The shallow and deep wells, 12 and 14 respectively, are patterned again and etched anisotropically through the upper etch stop 16 without hurting the sidewall etch stops and the newly formed oxide etch stop on top of the top substrate 6.

The deep wells 14 are patterned and the center substrate layer 8 is etched all the way to the bottom etch stop. An isotropic $XeF_2$ release etch is performed that attacks the center substrate 8. The etch progresses radially from the ends of the shallow wells 12, and cylindrically from the deep wells 14; ultimately merging and creating a larger membrane on the top substrate and a smaller membrane on the bottom substrate. The etch has to be stopped before the radial etches reach the bottom surface to ensure that the bottom membrane is smaller in size. By choosing the location and count of the wells a center "piston" like connecting structure 13 remains at the center substrate 8, connecting the top and bottom substrates, 6 and 10, and forming the transducer function. The connecting structure 13 may connect the top 6 and the bottom layer 10 to form the pressure transducer.

The multilayer substrate may be comprised of silicon, glass, polymers or metals; or a combination thereof. The etch stop layers may be comprised of thermal oxide or a metal. The sidewall etch stop layers may be comprised of thermal oxide or a CxFy polymer, wherein x and y are independent integers. The isotropic etchant may be comprised of $XeF_2$ gas, KOH, $SF_6$ plasma (if the substrates are Silicon), HF (if the substrates are glass), oxygen plasma (if the substrates are polymers).

In another embodiment, the microfabricated pressure transducer may comprise an etch stop on top of the top substrate; the top substrate having a number of holes called shallow wells, which are passivated on the sidewalls and which breached the top etch stop; the top and center substrate having a number of holes called deep wells, which are passivated on the sidewalls only in the region of the top substrate; the center substrate having furthermore a larger void as a result of an isotropic etch that connects all wells with each other on the top part of the center substrate; but where only the deep wells are connected on the bottom part of the center substrate; thus creating a larger perforated membrane on the top substrate and a smaller unperforated membrane on the bottom substrate, which are optionally be connected by a piston like structure out of the center substrate and therefore form a force-to-pressure transducer.

The systems and methods described herein may be particularly applicable to systems needing a compact, inexpensive pressure transducer. However, they may also be applicable to any integrated circuit formed on a device wafer and encapsulated with a lid wafer.

Accordingly, a microfabricated pressure transducer has been described, which includes a substrate of one or more materials with two embedded etch stop layers defining a top, center and bottom substrate part, the top substrate part having a number of shallow wells extending through the top substrate part, and defining a perforated membrane in the top substrate part which is suspended over a first void. The top and center substrate parts may also have a plurality deep wells, the deep wells being deeper than the shallow wells and extending through the top and center substrate parts, and defining a smaller unperforated membrane on the bottom substrate which is suspended over a second void, wherein the perforated and unperforated membranes form a force-to-pressure transducer.

The shallow wells may be passivated on the sidewalls which breached the top etch stop. The deep wells are passivated on the sidewalls only in the region of the top substrate. The center substrate part may have a void that connects the shallow and the deeper wells with each other on the top part and the center substrate parts. The deep wells may be connected on the center substrate part. The shallow wells may define the larger perforated membrane on the top substrate. The deeper wells may define the smaller unperforated membrane on the bottom substrate. The membranes may be connected by a piston structure in the center substrate part, thereby forming the force-to-pressure transducer.

The substrate parts may be comprised of at least one of silicon, glass, polymers, metals, and combinations thereof. The embedded etch stop layers may be comprised of thermal oxide or a metal. The sidewalls on the etch stop layers may be comprised of at least one of a thermal oxide and a $C_xF_y$ polymer, wherein x and y are two different integers. The wells may be formed by an isotropic etchant, and may be spaced radially around a center point, with the shallower wells located at a larger radius than the deeper wells.

The isotropic etchant may comprise at least one of $XeF_2$ gas, KOH, $SF_6$ plasma, HF, and oxygen plasma. The perforated membrane may include about 4 shallower wells and about 10 to about 15 deeper wells. The anisotropic etchant may comprise at least one of $XeF_2$ gas, KOH, $SF_6$ plasma, HF, and oxygen plasma. The perforated membrane includes about 4 shallower wells and about 10 to about 15 deeper wells.

Further, a method has been disclosed for forming a microfabricated pressure transducer. The method may include providing a multilayer substrate having a top, center and bottom layer, wherein the layers are separated by top and bottom etch stop layers, forming a plurality of holes through the top layer and top etch stop layer, and forming a void below the top layer and top etch stop layer and above the bottom layer and bottom etch stop layer, but leaving at least one structure connecting the top and the bottom layers to form the pressure transducer.

Within this method, the holes may comprise a plurality of shallow wells formed through the top layer. The method may further include passivating at least the top substrate to form sidewall etch stops without passivating an interface to the second layer, continuing to etch a subset of the shallow wells anisotropically through most or all of the center substrate to form deep wells. The method may further include etching the center layer isotropically down and outward from the wells to create a membrane on the top layer and a membrane on the bottom layer, and stopping the isotropic etch so that the etch front from the shallow wells does not contact the bottom membrane thus making the top membrane larger than the bottom membrane. The method may further include arranging the wells so that some of them are spaced sufficiently to surround one or several future piston, and stopping the isotropic etch so that the etch fronts from the sufficiently spaced wells do not meet and thus forms a piston-like connection between the top membrane and bottom membrane.

The method may further include etching the center layer to form a void that connects the shallow and the deeper wells with each other on the top part and the center substrate parts. The deep wells may be connected on the center substrate part. The shallow wells may define the larger perforated membrane on the top substrate. The deeper wells may define the smaller unperforated membrane on the bottom substrate.

The three layer substrate may comprise silicon, glass, polymers, metals and a combination thereof, wherein the etch stops may comprise at least one of a thermal Oxide or a CxFy polymer, and wherein the isotropic etch uses at least one of $XeF_2$ gas, KOH, $SF_6$ plasma, HF, and oxygen plasma.

While various details have been described in conjunction with the exemplary implementations outlined above, various alternatives, modifications, variations, improvements, and/or substantial equivalents, whether known or that are or may be presently unforeseen, may become apparent upon reviewing the foregoing disclosure. Accordingly, the exemplary implementations set forth above, are intended to be illustrative, not limiting.

What is claimed is:

1. A microfabricated pressure transducer, comprising:
   a substrate of one or more materials with two embedded etch stop layers defining a top, center and bottom substrate part, the top substrate part having a number of shallow wells extending through the top substrate part, and defining a perforated membrane in the top substrate part which is suspended over a void;
   the top and center substrate parts also having a plurality of deep wells, the deep wells being deeper than the shallow wells and extending through the top and center substrate parts, and defining a smaller unperforated membrane on the bottom substrate, wherein the perforated and unperforated membranes form a force-to-pressure transducer.

2. The microfabricated pressure transducer of claim 1, wherein the shallow wells are passivated on the sidewalls which breached the top etch stop; and wherein the deep wells are passivated on the sidewalls only in the region of the top substrate.

3. The microfabricated pressure transducer of claim 1, wherein the void connects the shallow and the deeper wells with each other in the center substrate parts.

4. The microfabricated pressure transducer of claim 1, wherein the deep wells are connected on the center substrate part.

5. The microfabricated pressure transducer of claim 4, wherein the shallow wells define the larger perforated membrane on the top substrate.

6. The microfabricated pressure transducer of claim 4, wherein the deeper wells define the smaller unperforated membrane on the bottom substrate.

7. The microfabricated pressure transducer of claim 1, wherein the perforated membrane is connected to the bottom substrate part by a piston structure in the center substrate part, thereby forming the force-to-pressure transducer.

8. The microfabricated pressure transducer of claim 1, wherein the substrate parts are comprised of at least one of silicon, glass, polymers, metals, and combinations thereof.

9. The microfabricated pressure transducer of claim 1, wherein the embedded etch stop layers are comprised of at least one of a thermal oxide or a metal.

10. The microfabricated pressure transducer of claim 1, wherein the sidewalls on the etch stop layers are comprised of at least one of a thermal oxide and a $C_xF_y$ polymer, wherein x and y are two different integers.

11. The microfabricated pressure transducer of claim 1, wherein the wells are formed by an isotropic etchant and are spaced radially around a center point, with the shallower wells located at a larger radius than the deeper wells.

12. The microfabricated pressure transducer of claim 11, wherein the isotropic etchant comprises at least one of $XeF_2$ gas, KOH, $SF_6$ plasma, HF, and oxygen plasma, and wherein the perforated membrane includes about 4 shallower wells and about 10 to about 15 deeper wells.

13. A method for forming a microfabricated pressure transducer, comprising:
   providing a multilayer substrate having a top, center and bottom layer, wherein the layers are separated by top and bottom etch stop layers;
   forming a plurality of holes through the top layer and top etch stop layer; and
   forming a void below the top layer and top etch stop layer and above the bottom layer and bottom etch stop layer, but leaving at least one structure connecting the top and the bottom layers to form the pressure transducer.

14. The method of claim 13, wherein the holes comprise a plurality of shallow wells formed through the top layer.

15. The method of claim 14, further comprising:
   passivating at least the top substrate to form sidewall etch stops without passivating an interface to the second layer;
   continuing to etch a subset of the shallow wells anisotropically through most or all of the center substrate to form deep wells;
   etching the center layer isotropically down and outward from the wells to create a membrane on the top layer and a membrane on the bottom layer;
   stopping the isotropic etch so that the etch front from the shallow wells does not contact the bottom membrane thus making the top membrane larger than the bottom membrane;
   arranging the wells so that some of them are spaced sufficiently to surround one or several future piston; and
   stopping the isotropic etch so that the etch fronts from the sufficiently spaced wells do not meet and thus forms a piston-like connection between the top membrane and bottom membrane.

16. The method of claim 15, further comprising etching the center layer to form a void that connects the shallow and the deeper wells with each other on the top part and the center substrate parts.

17. The method of claim 15, wherein the deep wells are connected on the center substrate part.

18. The method of claim 15, wherein the shallow wells define the larger perforated membrane on the top substrate.

19. The method of claim 15, wherein the deeper wells define the smaller unperforated membrane on the bottom substrate.

20. The method of claim 15, wherein the three layer substrate comprises silicon, glass, polymers, metals and a combination thereof, wherein the etch stops comprise at least one of a thermal Oxide or a CxFy polymer, and wherein the isotropic etch uses at least one of $XeF_2$ gas, KOH, $SF_6$ plasma, HF, and oxygen plasma.

* * * * *